(12) United States Patent
Yang et al.

(10) Patent No.: US 10,481,654 B2
(45) Date of Patent: *Nov. 19, 2019

(54) HOLDER AND MOBILE TERMINAL

(71) Applicant: Huawei Device Co., Ltd., Dongguan (CN)

(72) Inventors: Xiangyang Yang, Shanghai (CN); Linfang Jin, Shenzhen (CN); Hualin Li, Shanghai (CN); Wenbing Tang, Shenzhen (CN); Jie Zou, Shenzhen (CN)

(73) Assignee: Huawei Device Co., Ltd., Dongguan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/878,017

(22) Filed: Jan. 23, 2018

(65) Prior Publication Data

US 2018/0150115 A1 May 31, 2018

Related U.S. Application Data

(63) Continuation of application No. 15/127,705, filed as application No. PCT/CN2014/073815 on Mar. 21, 2014, now Pat. No. 9,910,468.

(51) Int. Cl.
*G06F 1/20* (2006.01)
*H05K 9/00* (2006.01)
(Continued)

(52) U.S. Cl.
CPC ............ *G06F 1/203* (2013.01); *G06F 1/1626* (2013.01); *H05K 1/0203* (2013.01); *H05K 7/2039* (2013.01); *H05K 9/0024* (2013.01)

(58) Field of Classification Search
None
See application file for complete search history.

(56) References Cited

U.S. PATENT DOCUMENTS 5,581,443 A 12/1996 Nakamura et al.
6,266,941 B1 7/2001 Nishimoto
(Continued)

FOREIGN PATENT DOCUMENTS

CN 1373982 A 10/2002
CN 100407097 C 7/2008
(Continued)

OTHER PUBLICATIONS

"Service Manual for L1 and L2, Nokia Lumia 820 RM-824, RM-825 Version 1.0," Nokia Care Academy, pp. 1-31 (2012).
(Continued)

*Primary Examiner* — Robert J Hoffberg
(74) *Attorney, Agent, or Firm* — Leydig, Voit & Mayer, Ltd.

(57) ABSTRACT

A holder and a mobile terminal including the holder are disclosed. The holder is located in the mobile terminal, the holder includes a heat conduction area and a heat insulation area, the heat insulation area is close to an edge of the holder, the heat insulation area is adjacent to the heat conduction area, and a heat emitting element in the mobile terminal is proximate to the heat conduction area. The heat insulation area is provided on the holder, and the heat insulation area is close to the edge of the holder and is adjacent to the heat conduction area, so that, in a process of transferring heat in the heat conduction area to the edge of the holder, the heat is impeded by the heat insulation area, thereby reducing heat at the edge of the holder.

13 Claims, 8 Drawing Sheets

(51) Int. Cl.
*H05K 7/20* (2006.01)
*G06F 1/16* (2006.01)
*H05K 1/02* (2006.01)

(56) References Cited

U.S. PATENT DOCUMENTS

| | | | |
|---|---|---|---|
| 6,333,847 | B1 | 12/2001 | Katsui et al. |
| 6,414,844 | B1 | 7/2002 | Shimada et al. |
| 6,545,866 | B2 | 4/2003 | Katsui et al. |
| 6,570,086 | B1 | 5/2003 | Shimoji et al. |
| 6,859,364 | B2 | 2/2005 | Yuasa et al. |
| 6,938,968 | B2 | 9/2005 | Tanimoto et al. |
| 7,188,484 | B2 | 3/2007 | Kim |
| 7,412,846 | B2 | 8/2008 | Sekiya et al. |
| 7,486,517 | B2 | 2/2009 | Aapro et al. |
| 7,603,205 | B2 | 10/2009 | Barry et al. |
| 7,833,605 | B2 | 11/2010 | Tenra et al. |
| 8,673,471 | B2 * | 3/2014 | Yokoyama .......... H01M 2/1066 429/100 |
| 8,753,471 | B2 | 6/2014 | Yamada et al. |
| 8,790,477 | B2 | 7/2014 | Tenra et al. |
| 9,049,801 | B2 | 6/2015 | Rothkopf et al. |
| 9,578,791 | B1 | 2/2017 | Shen |
| 9,690,341 | B2 | 6/2017 | Shen |
| 9,729,207 | B2 | 8/2017 | Hwang et al. |
| 10,019,046 | B2 * | 7/2018 | Shen ....................... G06F 1/203 |
| 10,194,521 | B2 * | 1/2019 | Kim ........................ H02J 7/025 |
| 2003/0161132 | A1 | 8/2003 | Shimoji et al. |
| 2004/0244397 | A1 | 12/2004 | Kim |
| 2006/0126304 | A1 | 6/2006 | Smalc et al. |
| 2010/0072952 | A1 | 3/2010 | Nakajima et al. |
| 2011/0064983 | A1 | 3/2011 | Yokoyama et al. |
| 2012/0206882 | A1 | 8/2012 | Mohammed et al. |
| 2013/0141870 | A1 | 6/2013 | Rothkopf et al. |
| 2013/0301221 | A1 | 11/2013 | Wu |
| 2014/0102678 | A1 * | 4/2014 | Zou ...................... H05K 5/0213 165/135 |
| 2014/0355194 | A1 | 12/2014 | Shiraishi et al. |
| 2014/0369000 | A1 | 12/2014 | Kim et al. |
| 2017/0055367 | A1 | 2/2017 | Shen |

FOREIGN PATENT DOCUMENTS

| | | |
|---|---|---|
| CN | 201114231 Y | 9/2008 |
| CN | 201115242 Y | 9/2008 |
| CN | 201550395 U | 8/2010 |
| CN | 102017228 A | 4/2011 |
| CN | 202003615 U | 10/2011 |
| CN | 102438423 A | 5/2012 |
| CN | 202335181 U | 7/2012 |
| CN | 102711416 A | 10/2012 |
| CN | 103151318 A | 6/2013 |
| CN | 103209574 A | 7/2013 |
| CN | 203086894 U | 7/2013 |
| CN | 103348782 A | 10/2013 |
| CN | 203327471 U | 12/2013 |
| DE | 102011117490 A1 | 5/2013 |
| EP | 1233666 A1 | 8/2002 |
| EP | 2075993 A1 | 7/2009 |
| JP | H03003741 A | 1/1991 |
| JP | H11143584 A | 5/1999 |
| JP | 201142575 A | 5/2001 |
| JP | 2001308137 A | 11/2001 |
| JP | 2003188323 A | 7/2003 |
| JP | 3601282 B2 | 12/2004 |
| JP | 2005277163 A | 10/2005 |
| JP | 2006165154 A | 6/2006 |
| JP | 3810734 B2 | 8/2006 |
| JP | 2007019512 A | 1/2007 |
| JP | 2008131512 A | 6/2008 |
| JP | 2010165728 A | 7/2010 |
| JP | 2010251386 A | 11/2010 |
| JP | 2011119474 A | 6/2011 |
| JP | 2012048250 A | 3/2012 |
| JP | 2013150067 A | 8/2013 |
| JP | 2013214868 A | 10/2013 |
| JP | 2014517538 A | 7/2014 |
| WO | 2010032484 A1 | 3/2010 |
| WO | 2013018553 A1 | 2/2013 |
| WO | 2013108311 A1 | 7/2013 |
| WO | 2013108312 A1 | 7/2013 |
| WO | 2013191493 A1 | 12/2013 |

OTHER PUBLICATIONS

Yao, "High-Frequency Proximity Heating for Injection Molding Applications," Polymer Engineering and Science-2006, Wiley InterScience, pp. 938-945 (2006).

* cited by examiner

HOLDER AND MOBILE TERMINAL

CROSS REFERENCE TO RELATED APPLICATIONS

This application is a continuation of U.S. patent application Ser. No. 15/127,705, filed on Sep. 20, 2016, which is a National Stage of International Application No. PCT/CN2014/073815 filed on Mar. 21, 2014. The afore-mentioned patent applications are hereby incorporated by reference in their entireties.

TECHNICAL FIELD

The present disclosure relates to electronic devices in the communications field, and in particular, to a holder and a mobile terminal having the holder.

BACKGROUND

With the rapid development of configurations of mobile terminals, for example, a dominant frequency of an internal chip of the mobile terminal is increasingly high, an access speed of a memory is increasingly high, and correspondingly, radio frequency power amplification and a power management effect are increasingly high, overall heating of the mobile terminal correspondingly increases. Therefore, heat dissipation processing (which is also referred to as a heat dissipation design) on the mobile terminal becomes particularly important. Because of size, waterproof and dustproof, and noise requirements for the mobile terminal, a hermetic seal feature of the mobile terminal restricts using a fan to forcibly dissipate heat. In a case in which the heat can be dissipated only by using a surface of the mobile terminal, performing effective heat dissipation path management by combining a use habit and a heat reception feature becomes a core of the heat dissipation design of the mobile terminal. Research shows that, because the mobile terminal is designed to be thinner, to increase a battery capacity, an overlapping design of a battery and a circuit board becomes a concurrent design on a same plane. Consequently, heat source components (such as the biggest heating component CPU in the mobile terminal) in the mobile terminal are densely centralized in areas corresponding to a side frame and a circuit board that are of the mobile terminal. It can be known according to FIG. 1 that colors of the two areas in which the heat is relatively concentrated are relatively bright and temperatures are relatively high. However, an area in which heat sources are concentrated is a location that a user often touches when using the mobile terminal. Therefore, more effective heat dissipation processing needs to be performed on the mobile terminal.

In the related art, heat is generally transferred to a battery area by using a graphite sheet or by using a holder material of a higher heat conductivity coefficient, so as to reduce a temperature of an orthogonal projection area of the circuit board of the mobile terminal with respect to the holder. It can be obtained according to FIG. 2 and FIG. 3 that the heat dissipation design reduces a temperature of an area, corresponding to the circuit board, of the mobile terminal, but because of high heat conductivity of the holder, the heat can be more rapidly transferred to the side frame of the mobile terminal; as a result, a large quantity of heat sources are concentrated on the side frame of the mobile terminal (as can be seen in FIG. 2, a color of this area is relatively bright, which shows that the temperature of this area is relatively high).

SUMMARY

Embodiments of the present disclosure provide a holder, so as to reduce heat at a side frame of a mobile terminal.

According to an aspect, a holder is provided, located in a mobile terminal, where the holder includes a heat conduction area and a heat insulation area, the heat insulation area is close to an edge of the holder, the heat insulation area is adjacent to the heat conduction area, and a heat emitting element in the mobile terminal is proximate to the heat conduction area.

With reference to the first aspect, in a first possible implementation manner, the mobile terminal includes a side frame, the side frame surrounds the holder, and the heat insulation area isolates the heat emitting element from the side frame.

With reference to the first aspect, in a second possible implementation manner, the heat insulation area is provided with a heat insulation cavity, and the heat insulation cavity is vacuum or is filled with air.

With reference to the first aspect, in a third possible implementation manner, the heat insulation area is provided with a heat insulation cavity, the heat insulation cavity has a low heat conduction material, and the low heat conduction material has a heat conductivity coefficient range of 0-0.026 W/m-K.

With reference to the second possible implementation manner of the first aspect or the third possible implementation manner of the first aspect, in a fourth possible implementation manner, the heat insulation cavity is at least one strip-shaped hole or at least one elliptical hole.

With reference to the second possible implementation manner of the first aspect or the third possible implementation manner of the first aspect, in a fifth possible implementation manner, the heat insulation cavity includes at least one groove, and the groove is provided at an edge of the heat insulation area.

With reference to the first aspect, in a sixth possible implementation manner, an area of the heat insulation cavity occupies at least 50% of an area of the heat insulation area.

With reference to the first aspect, in a seventh possible implementation manner, the heat insulation area is made from a low heat conduction material, and the low heat conduction material has a heat conductivity coefficient range of 0-0.026 W/m-K.

With reference to the first aspect, in an eighth possible implementation manner, a material of the holder is a heat conduction material.

With reference to any one of the first aspect to the eighth possible implementation manner, in a ninth possible implementation manner, the holder is a display screen holder.

According to a second aspect, a mobile terminal is provided, including: a side frame, a heat emitting element, and the holder, where the side frame surrounds the holder.

According to the holder or the mobile terminal having the holder in the embodiments of the present disclosure, the heat insulation area is provided on the holder, and the heat insulation area is located at the edge of the holder and is adjacent to the heat conduction area, so that, in a process of transferring heat in the heat conduction area to the side frame, the heat is impeded by the heat insulation area, thereby reducing heat at the side frame.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and persons of ordinary skill in the art may still derive other drawings from these accompanying drawings without creative efforts.

DESCRIPTION OF EMBODIMENTS

The following clearly and completely describes the technical solutions in the embodiments of the present disclosure with reference to the accompanying drawings in the embodiments of the present disclosure. Apparently, the described embodiments are merely some but not all of the embodiments of the present disclosure. All other embodiments obtained by persons of ordinary skill in the art based on the embodiments of the present disclosure without creative efforts shall fall within the protection scope of the present disclosure.

Figure 1:
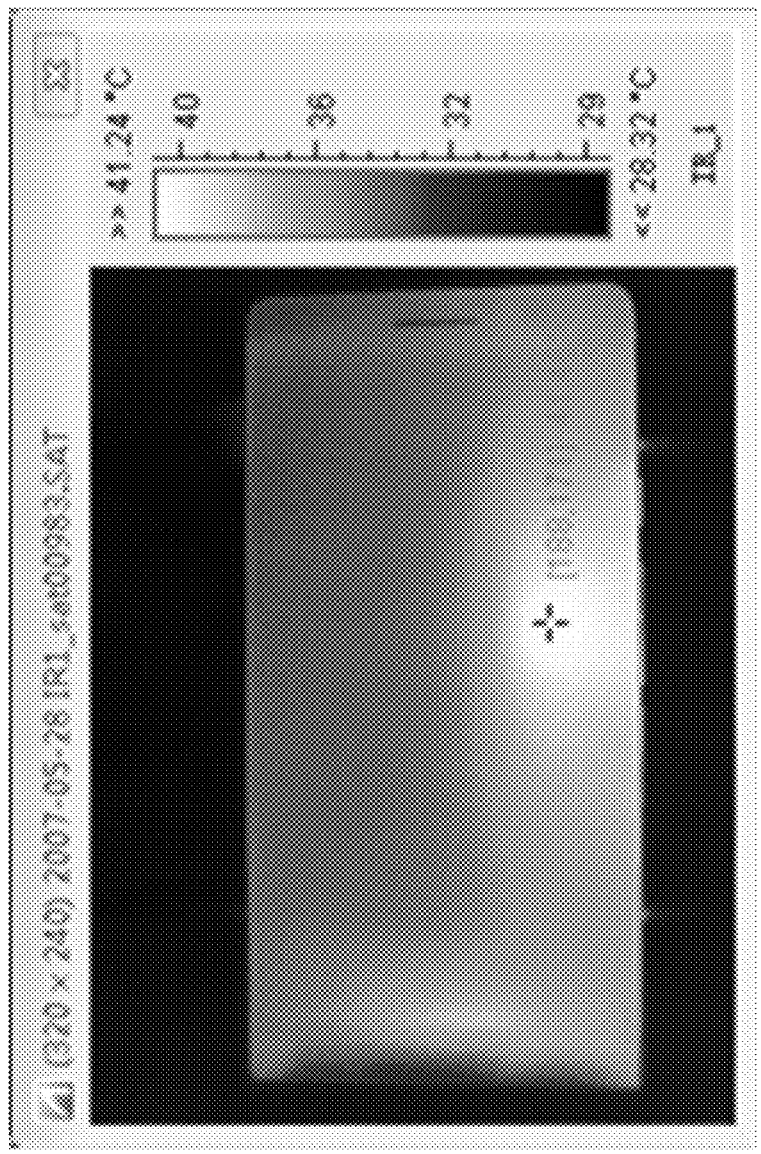
FIG. 1 and FIG. 2 are schematic diagrams of infrared temperature distribution of a front plane and a rear plane that are of a mobile terminal in the related art.
Figure 2:
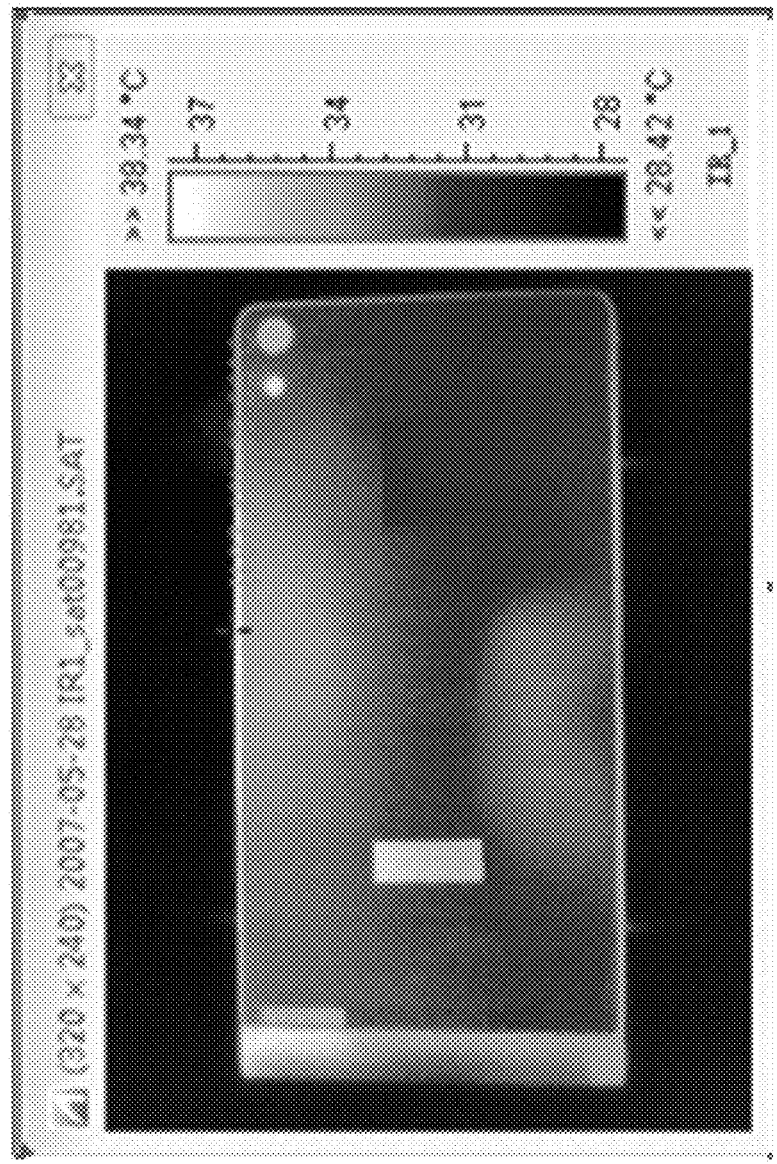
Figure 3:
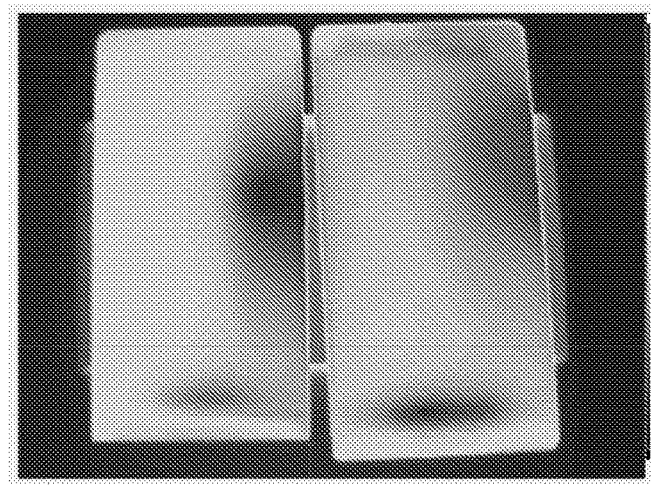
FIG. 3 is a schematic diagram of infrared temperature distribution of a front plane and a rear plane that are of another mobile terminal in the related art.
Figure 4:
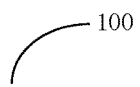
FIG. 4 is a schematic diagram of a mobile terminal according to Embodiment 1 of the present disclosure.
Figure 4:
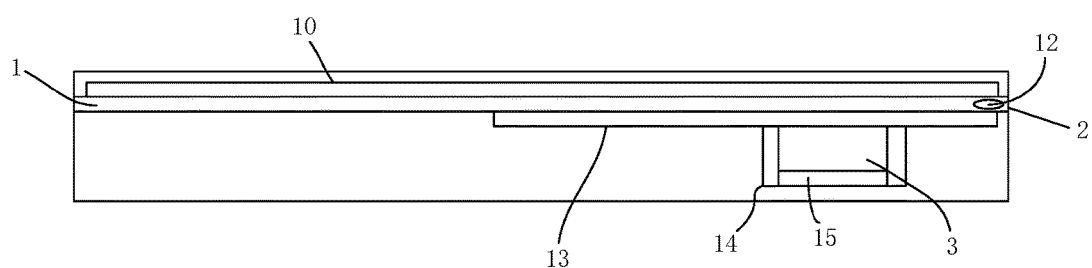
Figure 5:
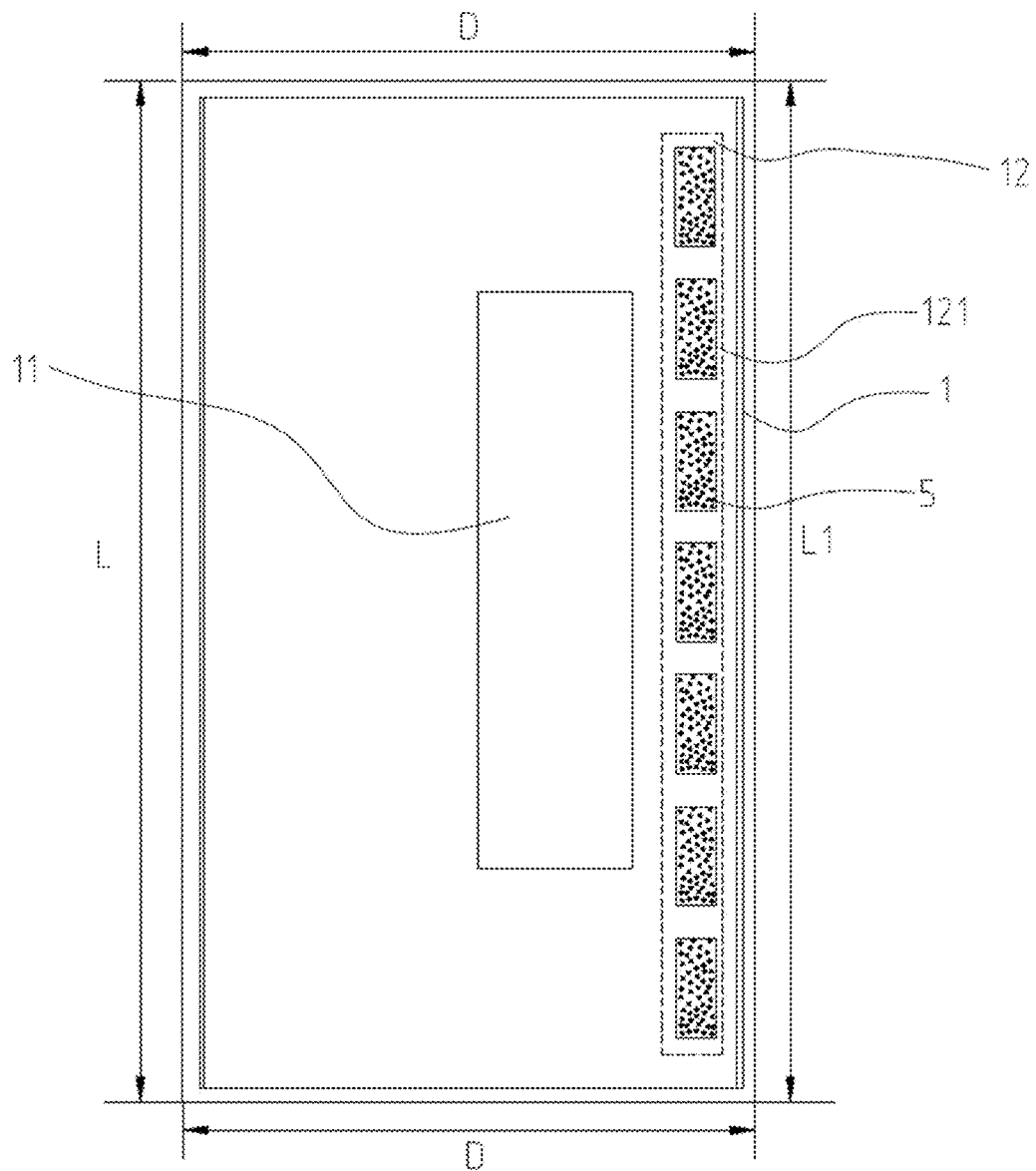
FIG. 5 is a schematic diagram of a holder in FIG. 4.

Referring to FIG. 4 and FIG. 5, a first embodiment of the present disclosure provides a mobile terminal 100. The mobile terminal 100 includes a side frame 2, a heat emitting element 3, and a holder 1. The holder 1 is located in the mobile terminal 100, the holder 1 includes a heat conduction area 11 and a heat insulation area 12, the heat insulation area 12 is close to an edge of the holder 1, the heat insulation area 12 is adjacent to the heat conduction area 11, the heat emitting element 3 in the mobile terminal is proximate to the heat conduction area 11, and the side frame 2 surrounds the holder 1.

According to the mobile terminal 100 provided in this embodiment of the present disclosure, the heat insulation area 12 is provided on the holder 1, and the heat insulation area 12 is close to the edge of the holder 1 and is adjacent to the heat conduction area 11, so that, in a process of transferring heat in the heat conduction area 11 to the side frame 2, the heat is impeded by the heat insulation area 12, thereby reducing heat at the side frame 2.

The heat insulation area 12 may be located between the side frame 2 and the heat conduction area 11.

In this embodiment, the mobile terminal 100 is a smartphone. Certainly, in another embodiment, the mobile terminal 100 may also be a tablet computer.

In this embodiment, the side frame 2 includes a pair of long edges L and a pair of short edges D. When a user uses the mobile terminal 100, the user generally holds the pair of long edges L. The heat emitting element 3 is integrated on a circuit board. The mobile terminal may include a shielding can 14, and the shielding can 14 surrounds the heat emitting element 3 on the circuit board, to prevent an electromagnetic field generated by the heat emitting element 3 from diffusing out, and prevent the electromagnetic field from being affected by an outside electromagnetic field. Optionally, stainless steel having a thickness of 0.2 mm and copper-nickel-zinc alloy having a thickness of 0.2 mm may be used as materials of the shielding can 14. There may be a heat conduction medium 15 between the shielding can 14 and the heat emitting element 3.

There may also be a heat conduction medium on the shielding can, the heat conduction medium is proximate to the heat conduction area 11, and the heat emitting element 3 is proximate to the heat conduction area 11, so that heat generated by the heat emitting element 3 can be more rapidly transferred to the holder 1. The heat may be transferred to the outside of the mobile terminal 100 by using the holder 1. The heat conduction medium may be heat conduction silica gel.

It can be understood that the mobile terminal may not have a shielding can. The holder 1 may play a role of a shielding can, that is, prevent the electromagnetic field generated by the heat emitting element 3 from diffusing out, and prevent the electromagnetic field from being affected by an outside electromagnetic field.

In this embodiment, the heat emitting element 3 is close to a right long edge L1 at a right side of the side frame 2, the heat conduction area 11 is generally provided close to the right long edge L1. The heat conduction area 11 is relatively near the right long edge L1; therefore, heat is much concentrated at the right long edge L1. To improve this situation, the heat insulation area 12 is provided close to the right long edge L1. Certainly, in another embodiment, the heat insulation area 12 may also be provided between the heat conduction area 11 and the short edge D according to an actual need, or provided between the heat conduction area 11 and the other long edge L; or the heat insulation area 12 may be separately disposed between the heat conduction area 11 and the long edge L and between the heat conduction area 11 and the short edge D.

For further improvement, the mobile terminal includes the side frame 2, the side frame 2 surrounds the holder 1, and the heat insulation area 12 may completely isolate the heat emitting element 3 from the side frame 2. The heat insulation area 12 completely isolates the heat emitting element 3 from the side frame 2, so that when the heat generated by the heat emitting element 3 is transferred to the side frame 2, the heat can pass through the heat insulation area 12, so as to impede all the heat, to improve a heat insulation effect of the heat insulation area 12.

In this embodiment, two ends, oppositely provided along a direction of the long edge L, of the heat insulation area 12 respectively exceed two ends, oppositely provided along the direction of the long edge L, of the heat conduction area 11. A size of the heat insulation area along the direction of the long edge L is greater than a size of the heat conduction area 11 along the direction of the long edge L; therefore, when the heat emitting element 3 emits heat and the heat is transferred to the heat conduction area 11, and when the heat in the heat conduction area 11 is transferred to the side frame, the heat passes through the heat insulation area 12, so that the heat insulation area 12 can prevent the heat in the heat conduction area 11. Certainly, in another embodiment, the mobile terminal 100 may further perform analysis according to main heat distribution in the heat conduction area 11, and then correspondingly set a size of the heat insulation area 12. That is, a length of the heat insulation area 12 along a length extending direction of the holder 1 is not necessarily greater than a length of the heat conduction area 11 along the holder 1, and may be less than or equal to the length of the heat conduction area 11 along the holder 1, as long as heat reception at a side of the mobile terminal 100 can satisfy an actually needed situation.

For further improvement, referring to FIG. 5, the heat insulation area 12 is provided with a heat insulation cavity 121, and the heat insulation cavity 121 is vacuum or is filled with air 5. A heat conductivity coefficient of the air 5 is approximately 0.026 W/m-K in a closed small gap and is far less than that of another material. For example, a heat conductivity coefficient of plastic is greater than 0.2 W/m-K, a heat conductivity coefficient of metal is within 10-400 W/m-K, and a heat conductivity coefficient of glass is approximately 2 W/m-K. The materials listed above are generally used to manufacture the holder 1. A medium with a relatively small heat conductivity coefficient is introduced to a material with a relatively large heat conductivity coefficient, so that heat resistance is formed at a location at which the medium with the relatively small heat conductivity coefficient is introduced in the holder 1, so as to form the heat insulation area 12. As vacuum is not heat-conductive, or the air 5 in the cavity has a small heat conductivity coefficient, heat resistance is formed at the location at which the medium of the relatively small heat conductivity coefficient is introduced in the holder 1, so that the heat insulation effect is better. In this embodiment, the heat insulation cavity 121 is filled with the air 5. Generally, in the related art, the air 5 exists in the mobile terminal 100. To enable the heat insulation cavity 121 to have the heat insulation effect, making the heat insulation cavity 121 have the air 5 is a relatively easy way, or the interior of the mobile terminal 100 may be made to be in a vacuum environment to make the heat insulation cavity 121 be vacuum. Certainly, in another embodiment, the heat insulation cavity 121 may also form heat resistance in another manner. For example, the heat insulation cavity 121 is configured to accommodate a low heat conduction material, and the low heat conduction material has a heat conductivity coefficient range of 0-0.026 W/m-K. In another embodiment, the heat insulation area 12 may be made from a low heat conduction material, and the low heat conduction material has a heat conductivity coefficient range of 0-0.026 W/m-K. The heat insulation area 12 is made from a material having a heat conductivity coefficient range of 0-0.26 W/m-K, and a heat conductivity coefficient of a material whose heat conductivity coefficient is within the heat conductivity coefficient range is far less than that of another material. For example, metal has a heat conductivity coefficient of 10-400 W/m-K, and glass has a heat conductivity coefficient of approximately 2 W/m-K. The materials listed above are generally used to manufacture the holder 1. A medium with a relatively small heat conductivity coefficient is introduced to a material with a relatively large heat conductivity coefficient, so that heat resistance is formed at a location at which the medium with the relatively small heat conductivity coefficient is introduced in the holder 1, so as to form the heat insulation area 12.

For further improvement, the heat insulation cavity 121 is at least one strip-shaped hole or at least one elliptical hole. The heat insulation area 12 is provided with the hole-shaped heat insulation cavity 121, so that processing on the holder 1 is relatively simple. In this embodiment, the heat insulation cavity 121 is at least one strip-shaped hole. Certainly, in another embodiment, the heat insulation cavity 121 may also be at least one elliptical hole or a hole of another shape.

The heat emitting element 3 may be a heating chip and there are three heat insulation cavities 121, which are strip-shaped holes. The holes have a length of 5 mm and have a width of 1 mm, and a gap between the holes is greater than 1 mm and less than 2 mm.

For further improvement, an area of the heat insulation cavity 121 occupies at least 50% of an area of the heat insulation area 12. The heat insulation cavity 121 is vacuum or is filled with the air 5, so that a heat-conducting property of the heat insulation cavity 121 becomes poorer, and heat resistance is formed. Therefore, a larger area of the heat insulation cavity 121 indicates a better heat insulation effect of the heat insulation area 12.

In this embodiment, in consideration of general strength of the material of the holder 1, there are seven heat insulation cavities 121, which are strip-shaped holes. Each of the strip-shaped holes has a dimension of 5 mm along the direction of the long edge L (that is, each of the strip-shaped holes has a length of 5 mm along the direction of the long edge L). The strip-shaped hole has a dimension of 1 mm along a direction perpendicular to the long edge L (that is, each of the strip-shaped holes has a length of 1 mm along a direction of the short edge). A spacing between two neighboring strip-shaped holes is 2 mm. The area of the heat insulation cavity 121 occupies approximately 50% of the area of the heat insulation area 12.

Figure 6:
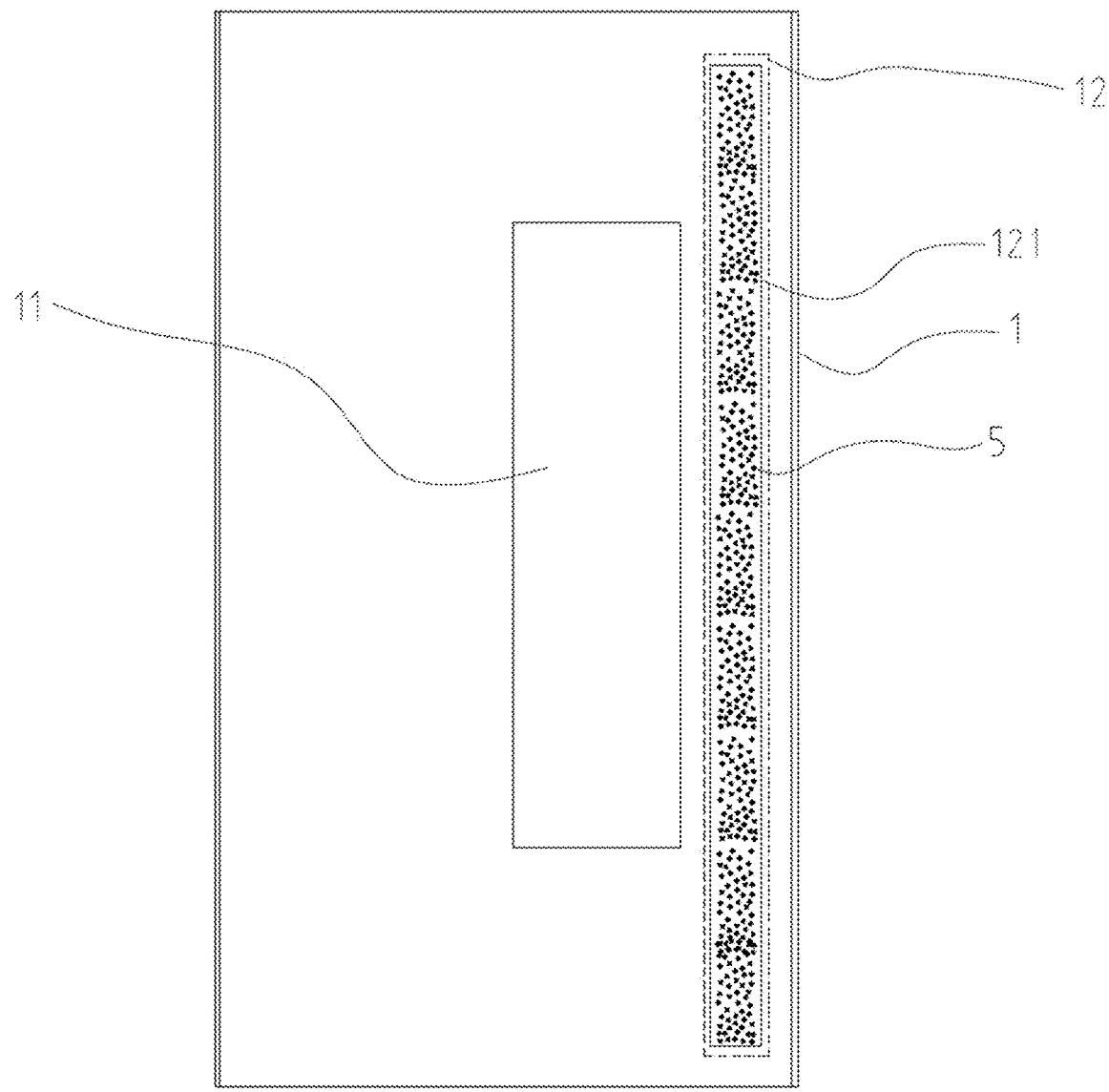
FIG. 6 is a schematic diagram of another holder in FIG. 4.

Referring to FIG. 6, when the strength of the holder 1 is higher, the heat insulation cavity 121 may also be one strip-shaped hole. That is, the area of the heat insulation cavity 121 occupies 100% of the area of the heat insulation area 12, thereby achieving a better heat insulation effect.

Figure 7:
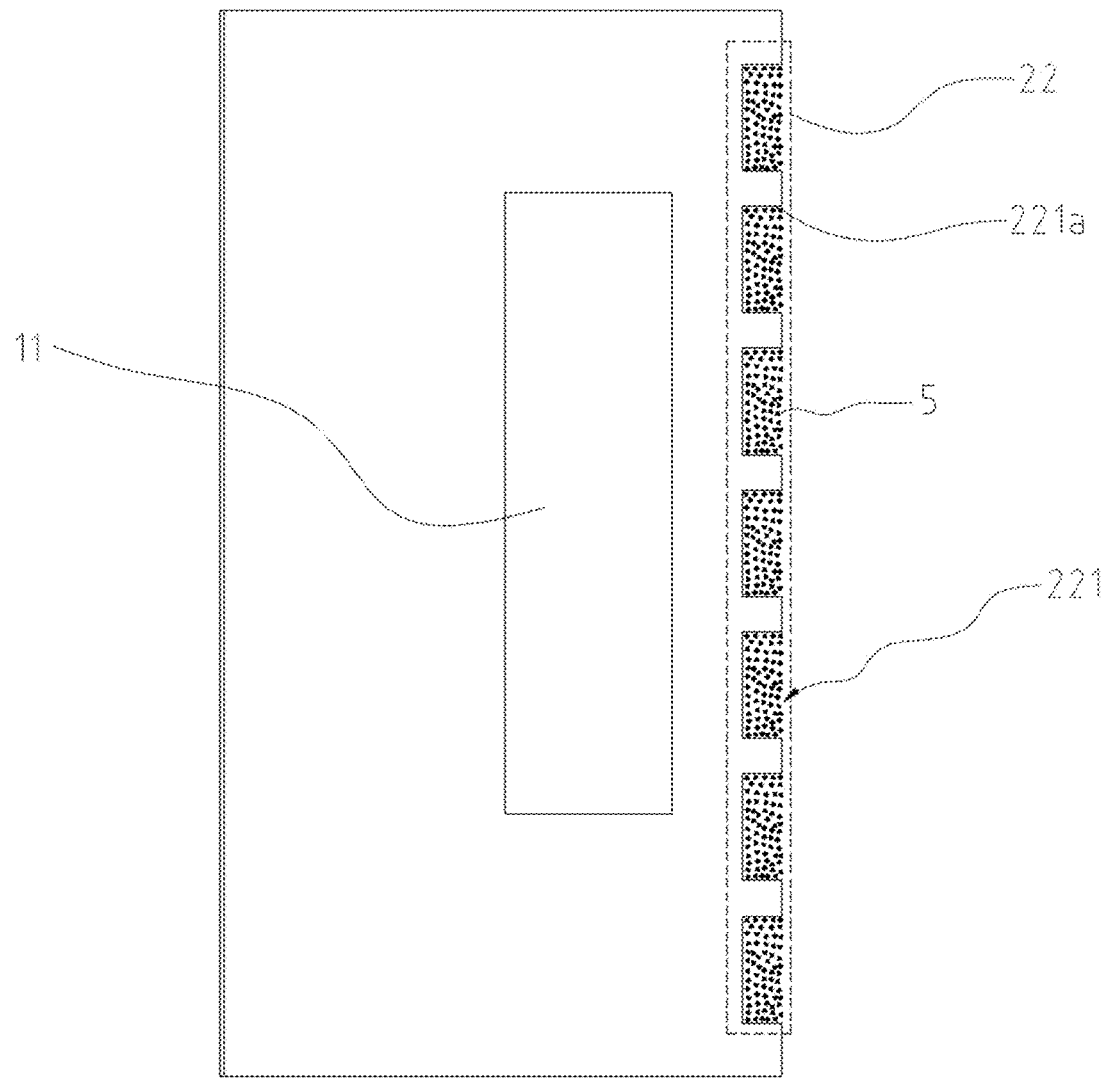
FIG. 7 is a schematic diagram of a holder according to Embodiment 2 of the present disclosure.

Certainly, in a second embodiment, as shown in FIG. 7, a heat insulation cavity 221 includes at least one groove 221a, where the groove 221a is provided at an edge of a heat insulation area 22. An inward dentiform structure is formed at an edge of the heat insulation area 22 because of existence of the groove 221a. In consideration of strength of a material of the holder 1, the heat insulation cavity 221 may include seven grooves 221a. Each of the groove 221a has a dimension of 5 mm along the direction of the long edge L (that is, each of the grooves 221a has a length of 5 mm along the direction of the long edge L). The groove 221a has a dimension of 1.5 mm along a direction perpendicular to the long edge L (that is, the groove has a length of 1.5 mm along the direction of the short edge). A spacing between two neighboring grooves 221a is 2 mm. An area of the heat insulation cavity 221 occupies approximately 50% of an area of the heat insulation area 22.

Figure 8:
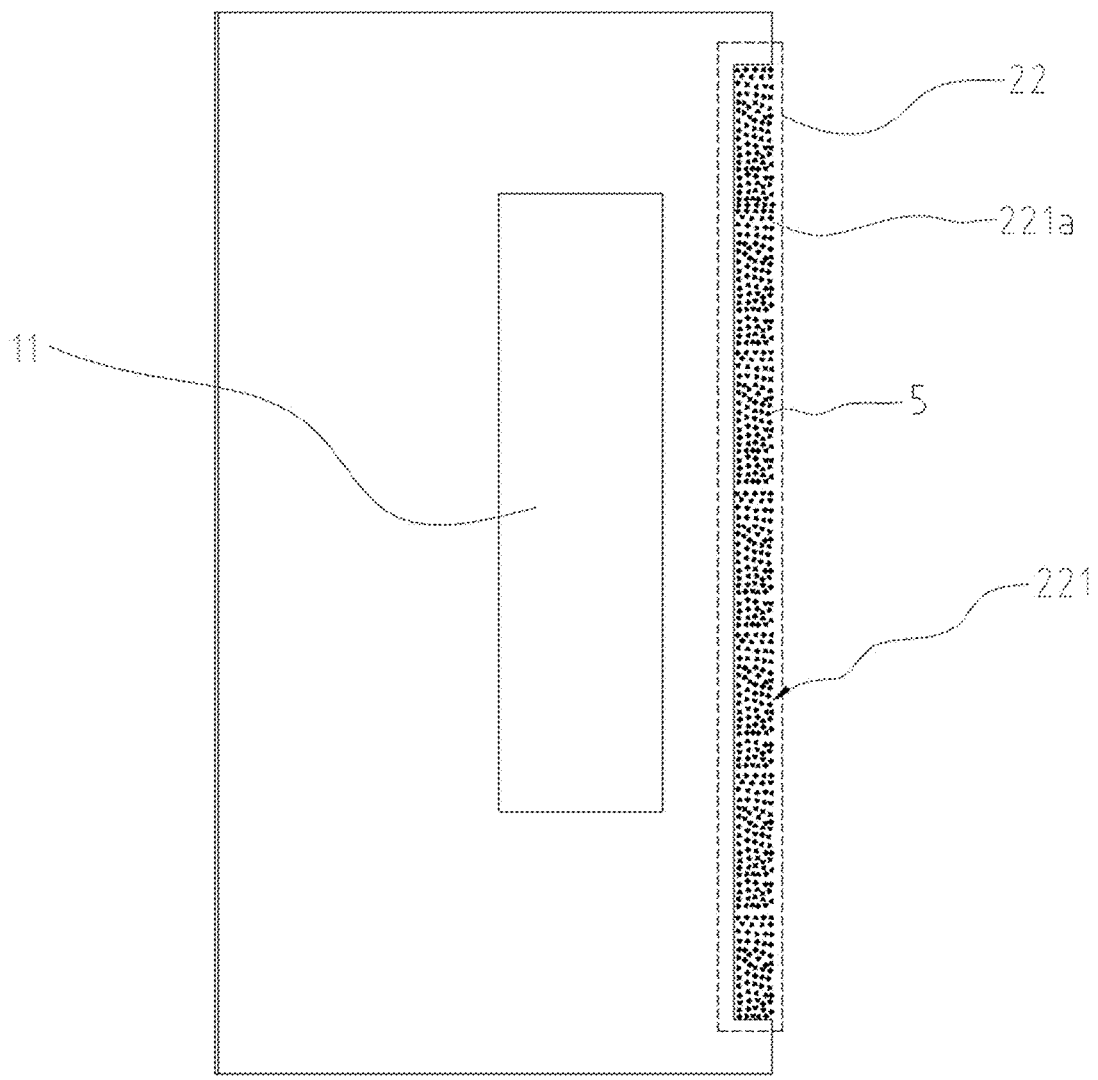
FIG. 8 is a schematic diagram of another holder provided in FIG. 7.

As shown in FIG. 8, when the strength of the holder 1 is higher, the heat insulation cavity 221 may also include one groove 221a. That is, the area of the heat insulation cavity 221 occupies 100% of the area of the heat insulation area 22, thereby achieving a better heat insulation effect. In another embodiment, the heat insulation cavity 221 may also be provided on a same holder 1 in a hole shape and in a form of the groove 221a according to an actual need.

Figure 9:
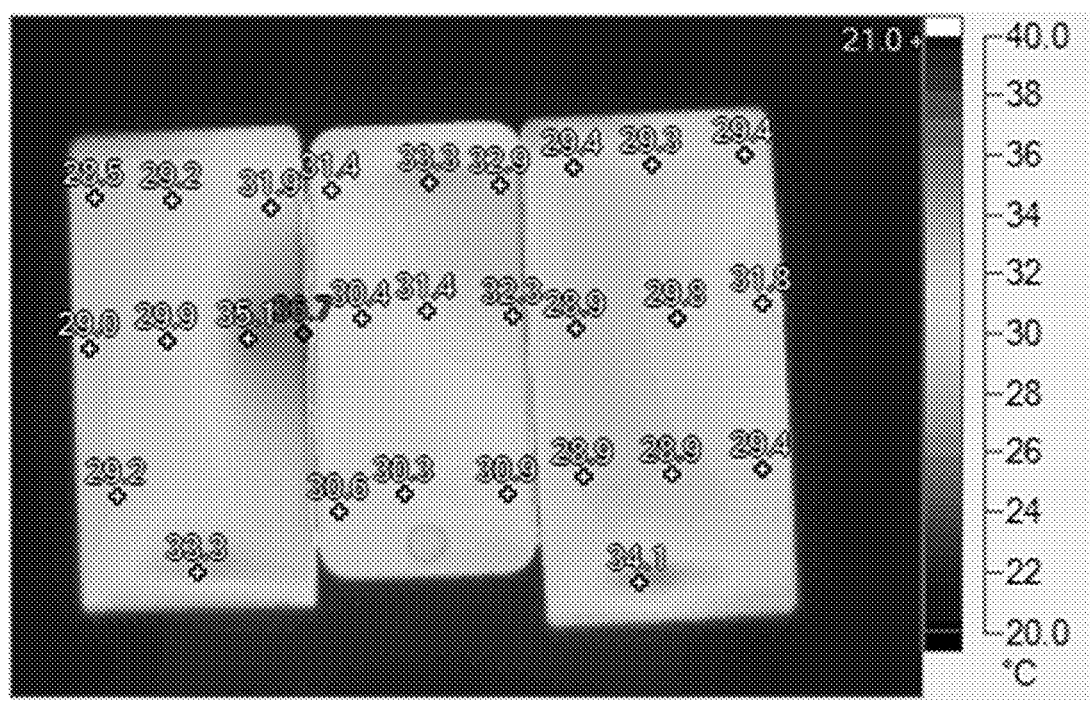
FIG. 9 is a schematic diagram of temperature distribution of the mobile terminal in FIG. 4.

Referring to FIG. 9, for a heat distribution status after the holder 1 is provided with the heat insulation cavity 121. Heat in the mobile terminal 100 is evenly distributed, and the heat is not concentrated on the side frame 2 of the mobile terminal 100.

For further improvement, the material of the holder 1 is a heat conduction material. Heat in the heat emitting element 3 is rapidly transferred to the holder 1 by means of heat conductivity of the holder 1, and then the heat is transferred to the outside of the mobile terminal 100, so that heat dissipation processing on the mobile terminal 100 is more effective. In this embodiment, to ensure a heat-conducting property of the holder 1, the material of the holder 1 may be graphite. When the holder 1 is located between a display screen 10 and the circuit board 13, heat in the circuit board 13 can be more rapidly transferred to the holder 1. In addition, the heat in the holder 1 can be more rapidly transferred to the outside of the mobile terminal 100 because of high heat conductivity of the holder 1, so that the heat dissipation processing on the mobile terminal 100 is more effective. Certainly, in another embodiment, the material of the holder 1 may also be another material according to an actual need of the mobile terminal 100. For example, if the mobile terminal 100 does not have a relatively high requirement on heat dissipation performance, the material of the holder 1 may also be a material with a relatively low heat-conducting property.

When the mobile terminal 100 starts to be equipped, the heat emitting element 3 first needs to be proximate to the heat conduction area 11, and the shielding can and the heat conduction medium are disposed between the heat emitting element 3 and the heat conduction area 11, so as to implement a shielding effect and a heat conduction effect. When the heat emitting element 3 starts to generate heat, the heat is transferred from the heat emitting element 3 to the holder 1 because of the heat conductivity of the holder 1, and subsequently the holder 1 transfers the heat to the side frame 2 of the mobile terminal 100. In a process of transferring the heat in the heat conduction area 11 to the side, because of the existence of the heat insulation area 12, the heat is impeded by heat resistance formed in the heat insulation area 12, so that heat at the side is relatively low, thereby ensuring that the heat at the side frame 2 of a housing of the mobile terminal 100 is relatively low.

The holder 1 is a display screen holder.

According to the mobile terminal 100 provided in this embodiment of the present disclosure, the heat insulation area 12 is provided on the holder 1, and the heat insulation area 12 is close to the edge of the holder 1 and is adjacent to the heat conduction area 11, so that, in a process of transferring heat in the heat conduction area 11 to the side frame 2, the heat is impeded by the heat insulation area 12, thereby reducing heat at the side frame 2.

In addition, the heat insulation area 12 completely isolates the heat emitting element 3 from the side frame 2, so that the heat insulation effect of the heat insulation area 12 is improved. The heat insulation area 12 is provided with the heat insulation cavity 121, where the heat insulation cavity 121 is vacuum or is filled with the air 5, so that heat insulation is relatively easy to be implemented in the heat insulation area 12. The heat insulation area 12 is made from a low heat conduction material, and the low heat conduction material has a thermal insulation coefficient range of 0-0.026 W/m-K, so that the heat insulation effect of the heat insulation area 12 is better. The heat insulation cavity 121 is at least one strip-shaped hole or at least one elliptical hole, so that processing on the holder 1 is relatively simple. The heat insulation cavity 121 includes at least one groove 221, and the groove 221 is provided at an edge of the heat insulation area 12, so that there are various providing manners for the heat insulation cavity 121. The area of the heat insulation cavity 121 occupies at least 50% of the area of the heat insulation area 12, so that the heat insulation effect of the heat insulation area 12 is better. The material of the holder 1 is a heat conduction material, so that the heat dissipation processing on the mobile terminal 100 is more effective.

Finally, it should be noted that the foregoing embodiments are merely intended for describing the technical solutions of the present disclosure but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present disclosure.

What is claimed is:

1. A mobile terminal, comprising:
   a holder;
   a side frame;
   a display screen; and
   a heat emitting element disposed on a circuit board;
   wherein the holder is a display screen holder which is located between the display screen and the circuit board, the side frame surrounds the holder, the holder comprises a heat conduction area and a heat insulation area, the heat insulation area is provided between the heat conduction area and an edge of the holder, and the heat conduction area is made of metal; and
   wherein the heat conduction area is provided to transfer heat generated by the heat emitting element, and, in a process of transferring the heat in the heat conduction area to the side frame, the heat insulation area is provided to impede the heat.

2. The mobile terminal according to claim 1, wherein the heat insulation area is provided close to a long edge of the side frame.

3. The mobile terminal according to claim 1, wherein the heat insulation area is provided with a heat insulation cavity with air.

4. The mobile terminal according to claim 3, wherein the heat insulation cavity is at least one strip-shaped hole.

5. The mobile terminal according to claim 4, wherein the mobile terminal further comprises a shielding cover, the shielding cover surrounds the heat emitting element on the circuit board.

6. The mobile terminal according to claim 5, wherein the heat emitting element is a chip.

7. The mobile terminal according to claim 1, wherein the heat insulation area is made of a low heat conduction material, the low heat conduction material has a heat conductivity coefficient range of 0-0.026 W/m-K.

8. The mobile terminal according to claim 1, wherein the mobile terminal further comprises a shielding cover, the shielding cover surrounds the heat emitting element on the circuit board.

9. The mobile terminal according to claim 8, wherein a heat conduction medium is provided between the shielding cover and the heat emitting element.

10. The mobile terminal according to claim 1, wherein a material of the holder is a heat conduction material.

11. The mobile terminal according to claim 1, wherein the heat emitting element is a chip.

12. The mobile terminal according to claim 1, wherein the mobile terminal is a mobile phone.

13. The mobile terminal according to claim 1, wherein the heat insulation area isolates the heat emitting element from the side frame.

* * * * *